United States Patent [19]

Gnant

[11] Patent Number: 4,623,768

[45] Date of Patent: Nov. 18, 1986

[54] FOLDABLE MEMBRANE SWITCH WITH FOLD REMOTE FROM CONTACT-CARRYING PANELS

[75] Inventor: Russell S. Gnant, Brookfield, Wis.

[73] Assignee: W. H. Brady Co., Milwaukee, Wis.

[21] Appl. No.: 759,712

[22] Filed: Jul. 29, 1985

[51] Int. Cl.⁴ .................................................. H01H 9/00
[52] U.S. Cl. ................................ 200/159 B; 200/5 A; 339/17 F
[58] Field of Search ........................... 200/159 B, 5 A; 361/398, 408; 174/68.5; 339/17 F, 176 MF

[56] References Cited

U.S. PATENT DOCUMENTS

| 4,066,851 | 1/1978 | White et al. | 200/159 B |
| 4,485,279 | 11/1984 | Nakamura | 200/159 B |
| 4,495,546 | 1/1985 | Nakamura et al. | 361/398 |

FOREIGN PATENT DOCUMENTS 7606726 10/1977 France ................................ 361/398

OTHER PUBLICATIONS

Allan, *Composite Switch and Cable*, IBM Technical Disclosure Bulletin, Sep. 1984—pp. 2378-2379.

*Primary Examiner*—Stephen Marcus
*Assistant Examiner*—Renee S. Luebke
*Attorney, Agent, or Firm*—Quarles & Brady

[57] ABSTRACT

Folded membrane switches (20, 50, 70) formed from foldable blanks (21, 51, 71) including two spaced contact-carrying panels (22,23) connected by an intermediate third panel (24). The blanks (21, 51, 71) are folded along the third panel (24) to position contacts (25, 27) on the contact-carrying panels (22,23) in alignment with one another, with a spacer layer (35, 61, 76) positioned therebetween to maintain the contacts (25, 27) in a normally separated or off condition. Part of the intermediate third panel (24) may be slit to define a tail (32, 58) or a tail (72) may extend from one of the contact-carrying panels (22, 23), the tail being used to connect the switch to external circuitry.

5 Claims, 14 Drawing Figures

FOLDABLE MEMBRANE SWITCH WITH FOLD REMOTE FROM CONTACT-CARRYING PANELS

TECHNICAL FIELD

This invention relates to electrical switches of the type having conductive patterns disposed on two spaced layers of flexible plastic film.

BACKGROUND ART

The term membrane switches is used herein to refer to electrical switches constructed of at least two layers of plastic film spaced from one another so that a surface of one film faces a surface of the other film. The two facing surfaces each carry a conductive pattern that is typically printed on the film surfaces with conductive inks or applied onto the films by vacuum metalizing techniques. The conductive patterns include contact zones connected by conductive tracks that connect the conductive patterns to external circuitry. The films are spaced from each other by a spacer layer between the two facing surfaces of the films, which is generally a patterned adhesive layer or a die-cut plastic film having apertures positioned between contact zones of the conductive pattern on the surface of one film and contact zones of the conductive pattern on the facing surface of the other film. Thus, in the deactivated condition, the spacer layer maintains the contact zones of one circuit pattern spaced apart from the other conductive pattern. One of the films is arranged to be flexed or depressed toward the other in the activated condition of the switch to thereby establish an electrical circuit between a selected contact zone of one pattern with its mating contact zone of the conductive pattern on the other layer, thereby generating a signal that can be detected by external circuitry to which the membrane switch is connected.

Membrane switches presently find widespread use in installations in which a sealed or protected switch or operating panel is desirable. For example, they are employed in equipment which requires manual data entry such as computer keyboards, terminals, cash registers and the like. Also, membrane switches are widely used as a control or instrument panel for appliances such as washers and microwave ovens, industrial controls, copy machines, and the like, in which finger touch micro-motion actuation is a useful feature.

Membrane switches are actuated by an operator depressing, with a finger, a designated key area of one layer of the switch towards the other layer, the two layers being closely spaced from one another so that only a slight amount of movement of the layer which is depressed is required for proper operation.

Membrane switches have been primarily of the resistance type in which two conductive zones or contacts are closed and electric current flows through them in proportion to the voltage applied across them. Resistance switches are well known in the art and particular constructions for this type of membrane switch are disclosed in a number of patents assigned to the assignee of this application, including e.g., U.S. Pat. Nos. 4,217,473, 4,218,600 and 4,264,797. A more recent development in the art of membrane switches is the capacitance type of membrane switch which operates upon the change in capacitance between spaced conductive zones and are described for example, in U.S. Pat. No. 4,359,720 assigned to the assignee of this application.

Membrane switches are presently made either as a laminated construction or a folded construction. In a laminated construction, two plastic film layers that are to carry conductive patterns are made from separate or independent panels cut to the desired configuration. A conductive pattern is applied to a surface of each panel, the two panels are then properly registered relative to one another and laminated together to form a completed switch with a spacer layer positioned between the two panels. The spacer layer may be an adhesive layer or a plastic film carrying adhesive on both of its surfaces, and thus serve to laminate the two ciruit-carrying panels together, or a plastic film without adhesive. Most commercial membrane switches are made in this fashion at the present time. In a folded construction, by comparison, a single sheet of plastic film is die-cut to form the two panels that are to carry conductive patterns in a configuration in which the panels are joined together along a fold line. A conductive pattern including contact zones is applied to a surface of one panel and another conductive pattern with contact zones is applied to what will be the facing surface of the other panel with the sheet in a flat condition. Thereafter, one contact-carrying panel is folded along the fold line so as to overlie the other contact-carrying panel, after which the two panels are joined together with a spacer layer of adhesive or die-cut film having adhesive on its opposed surfaces.

My present invention relates to the folded type of membrane switch.

Folded membrane switches are described in a number of U.S. patents, including the following of which I am aware:

| | |
|---|---|
| 3,745,288 | 4,207,444 |
| 3,909,564 | 4,264,477 |
| 3,911,234 | 4,336,529 |
| 3,982,081 | 4,356,358 |
| 4,028,509 | 4,365,408 |
| 4,066,851 | 4,440,990 |
| 4,145,584 | 4,440,999 |
| | 4,451,714 |

The prior art folded style of membrane switches such as described in the above patents have a common structural feature: the panels that carry the contact zones are contiguous with one another along the fold line about which one of the panels is to be folded over the other. The panels are arranged in either a side-by-side or end-to-end juxtaposition along the fold line. Thus, in these prior art constructions, the sheet of film is die cut into a blank of the desired size and configuration in which one contact-carrying panel is connected to the other contact-carrying panel along the fold line about which one panel is folded relative to the other.

The prior art folded membrane switches such as described above have a number of problems. (1) The fold line is at an edge of the switch between the two panels carrying contact zones. This produces a bulge along the edge of the membrane switch, that can be visible through the faceplate or other covering panel which generally comprises a printed plastic film carrying graphic information for identification of the individual key sites. The bulge produced by the fold line is objectionable, and it would be desirable to eliminate it in a folded membrane switch construction. (2) In order to reduce the objectionable characteristic of the fold line as discussed above, the fold at the edge of the switch is often made as tight as possible to minimize the bulge. This exerts high stress on the conductive pattern at the fold line, which can result in switch failure. (3) The portion of the conductive pattern crossing the fold line is left uncovered in the typical folded membrane switch construction. This uncovered portion is thereby exposed to external contaminants which can attack and degrade the circuit pattern. (4) In addition, membrane switches are often applied to an apparatus by means of a layer of pressure sensitive adhesive along the bottommost surface of the switch. However, since it is undesirable that the application adhesive extend around the fold line to the top of the switch, the adhesive is generally undersized along the bottom surface of the switch so that there is a portion of the bottom surface adjacent the fold line which is not covered by application adhesive. This means there is no adhesive attachment of the switch to a panel or other article to which the switch is to be attached along this area adjacent the fold line. (5) While the two panels of a folded switch are joined to each other by a spacer layer, the effect of having the fold line along the edge of the two panels is to cause the panels to separate over a period of time. This is undesirable and can lead to malfunctioning of the switch.

SUMMARY OF THE INVENTION

I have developed a new folded membrane switch construction, which is described in detail hereinafter, to solve each of the problems with known folded membrane switch constructions as discussed above. According to my present invention, a folded membrane switch is provided wherein the fold line between layers of the switch is remote from the two contactcarrying panels of the switch.

BRIEF DESCRIPTION OF THE DRAWINGS

The present invention is described below in the full detail required by 35 U.S.C. §112 to enable those skilled in the art to practice it and also to set forth the presently-contemplated best modes for its practice, all reference to the following drawings.

DETAILED DESCRIPTION

Part (a) of the following description describes the prior art folded membrane switch construction illustrated in the drawings, and parts (b)-(d) describe the three embodiments of the present invention illustrated in the drawings.

(a) Prior Art Construction

Figure 1:
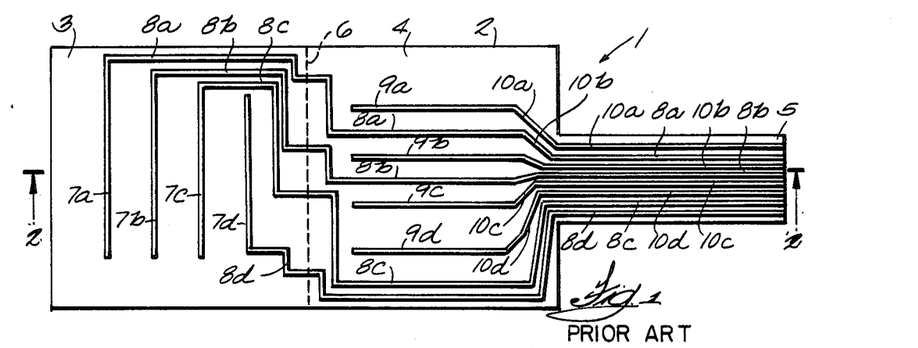
FIG. 1 is a plan view of a blank for a typical prior art folded membrane switch.
Figure 2:
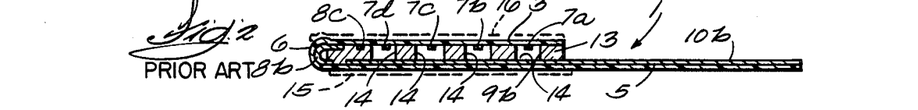
FIG. 2 is a sectional view of a folded switch formed from the blank of FIG. 1.

FIGS. 1 and 2 illustrate a typical folded membrane switch 1 as taught by the prior art.

The membrane switch 1 is made from a single sheet of plastic film cut to shape to form a blank 2 including a first contact-carrying panel 3, a second contact-carrying panel 4 and a tail 5 extending from one edge of panel 4. The panels 3 and 4 are contiguous and are separated from one another along a fold line 6, depicted in the drawings as a dashed line. The fold line 6 may be a crease in the film from which the blank is made, or a series of spaced slits or slots, spaced perforations, and the like, so as to provide a zone along which one contact-carrying panel can be folded over the other.

Panel 3 carries a series of four spaced conductive contact zones 7a-7d on its upper surface as viewed in FIG. 1, each zone comprising a vertical line. Each conductive zone 7a-7d is connected at its end to a conductive track 8a-8d, respectively, that leads across panels 3 and 4 and onto the tail 5. Similarly, the upper surface of the panel 4 of the blank carries a series of four spaced conductive contact zones 9a-9d shown as a set of spaced horizontal lines, each connected at one of its ends to a conductive track 10a-10b, respectively, that extends onto the tail 5.

FIG. 2 illustrates the switch 1 in its assembled condition. Contact-carrying panel 3 is folded along fold line 6 to overlay contact-carrying panel 4. A spacer layer 13 is positioned between the panels 3 and 4 and joins the panels together to form a sandwich construction with the interior surface of panel 3 facing and spaced from the interior surface of panel 4. The spacer layer 13 may be a patterned layer of adhesive (e.g. pressure sensitive, thermosetting, etc.) or a thin film of plastic coated on both surfaces with adhesive. In this condition, the contact zones 7a-7d on the interior surface of panel 3 intersect the contact zones 9a-9d on the interior surface of panel 4. Each intersection of a zone 7 and a zone 9 defines an individual switch site, there being a total of 16 switch sites in the switch 1. The spacer layer has a plurality of apertures 14, there being one aperture at each switch site as shown in FIG. 2. The spacer layer keeps the panels 3 and 4 separated from one another at a switch site until such time as a site is to be actuated by an operator pressing part of panel 3 to push a conductive zone 7a-7d into contact with a conductive zone 9a-9d at the selected site.

A membrane switch such as switch 1 is typically supported on a panel or other structure of the apparatus with which the switch is combined by means of a layer of adhesive along the exterior surface of panel 4 as indicated by dashed layer 15 in FIG. 2. Also, the exterior surface of panel 3 is generally covered by a faceplate, as indicated by dashed layer 16. The faceplate bears alphanumeric graphics to identify individual switch sites and may include informational graphics to facilitate operation of the switch or decorative graphics to enhance its appearance. The faceplate is most often a plastic film printed with the selected graphics.

FIG. 2 also illustrates a number of the problems of prior art folded membrane switches which were discussed previously. (1) As illustrated along the fold line 6, a bulge is developed when panel 3 is folded over panel 4. This in turn can result in a bulge in the faceplate layer 16, which can be objectionable in many uses of a membrane switch. (2) It will be noted that part of the conductive pattern on the panels 3 and 4 extends across the interior of the fold line 6. For example, conductive track 8b that extends from panel 3 across panel 4 and onto tail 5 is bent around the interior of the fold line 6. When the fold line is made very tight to eliminate problem (1), there will be a high stress imposed upon part of the conductive pattern such as the conductive track 8b. (3) Due to the presence of the fold line 6 between the contact-carrying panels 3 and 4, there is a space between the innermost edge of the spacer layer 13 and the fold line which generally cannot be avoided during manufacture of this type of folded membrane switch. This space thereby exposes some of the conductive pattern to the environment. Moisture can attack and degrade a pattern which is printed with silver conductive ink, as typically used. For example, the presence of water can cause silver migration in which silver ions in solution will move from a track at one potential to another track at a different potential. This may cause undesired bridging of adjacent parts of the conductive patterns. (4) The dashed adhesive layer 15 of FIG. 1 is the application adhesive which is used to apply the switch 1 to an article or panel of an apparatus. The application adhesive cannot extend about the fold line, so that it is generally necessary that the manufacturer of the switch terminate the layer of application adhesive 15 short of the fold line such as illustrated in FIG. 2. This results in part of the fold line area that is not adhered to the article to which the switch is to be attached. (5) The stresses imposed by the fold line 6 can act over a period of time to cause separation of panels 3 and 4 from the spacer layer 16. This would cause the two panels to separate from one another and can result in malfunction of the switch.

(b) New Folded Switch, FIGS. 3-6

Figure 3:
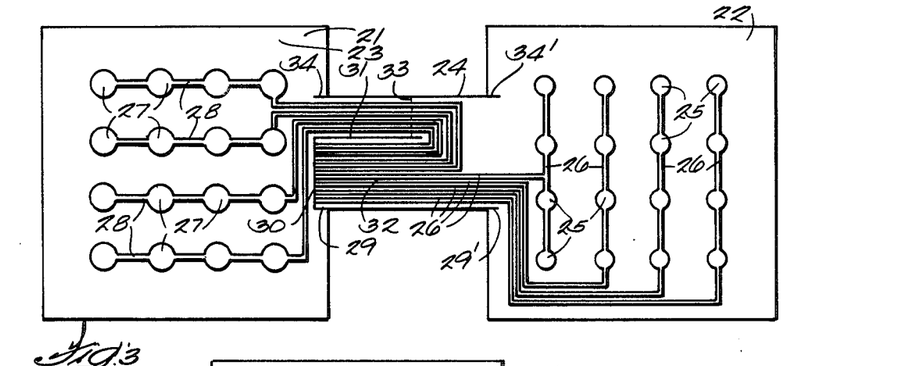
FIG. 3 is a plan view of a blank for a first embodiment of a membrane switch according to the present invention.

FIGS. 3, 4, 5 and 6 illustrate a folded membrane switch 20 as a first embodiment of the present invention that is formed from the blank 21 shown in plan view in FIG. 3. The blank 21 includes a first contact-carrying panel 22 and a second contact-carrying panel 23 that are connected together by an intermediate third panel 24. Thus the contact-carrying panels 22 and 23 are separate from one another instead of being contiguous as in the prior art folded switch 1 described above.

Panel 22 carries a circuit pattern comprising a plurality of contact zones 25, illustrated as round conductive pads but other configurations may be employed, connected together in columns by conductive tracks 26 that extend across the panel 22 and onto the third panel 24. Panel 23 carries a circuit pattern comprising a plurality of contact zones 27, which also may be of configurations other than the round pads of the illustrative embodiment, connected together in rows by conductive tracks 28 that extend across panel 23 and onto panel 24.

Third panel 24 is separated from contact-carrying panel 23 along a short first edge slit 29, end slit 30 extending from slit 29 transversely across the panel 23, and a second edge slit 31 extending longitudinally from the end of end slit 30. The second edge slit 31 also extends part way across third panel 24 to terminate within the third panel. The slits 29, 30 and 31 define a tail portion 32 of the third panel. Each conductive track 26 and 28 extends to the end slit 30 so as to be carried by the tail portion 32. Fold line 33 extends across third panel 24 from an outer edge thereof to second edge slit 31; the fold line may contact the intermediate portion of slit 31 as shown, or can be positioned to contact the end of slit 31. Also, slit 34 is cut through panel 23 and extends into the panel the same distance as the first edge slit 29. Slits 29' and 34' are cut through panel 22 from its edges connected to third panel 24 and correspond in length to slits 29 and 34 respectively.

Figure 4:
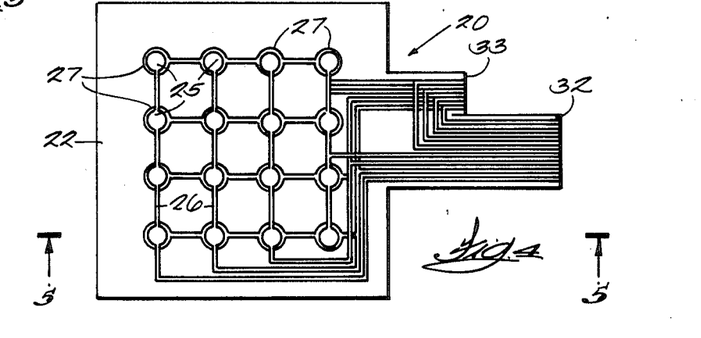
FIG. 4 is a plan view of a folded membrane switch of the present invention formed from the blank illustrated in FIG. 3.

To form the switch 20 from blank 21, referring first to FIG. 4, third panel 24 is folded along fold line 33 so as to position first contact-carrying panel 22 over second contact-carrying panel 23. The fold line 33 is thus remote from the contact-carrying panels 22 and 23 instead of being between them as in the prior art construction because fold line 33 is defined in the intermediate third panel 24. During the foregoing folding action, the tail section 32 of the third panel 24 is rotated away from the panel 23 to a horizontal position as in FIG. 4 where its end extends away from the panels 22 and 23.

Figure 5:
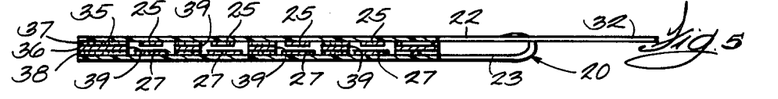
FIG. 5 is a sectional view of the switch in the folded condition of FIG. 4 taken along the plane of line 5—5 of FIG. 4.

Folding of the blank 21 along the fold line 33 places the first contact-carrying panel 22 and the second contact-carrying 23 in registration with one another in which the contact zones 25 of panel 22 are aligned with contact zones 27 of the panel 23. Turning now to FIG. 5, spacer layer 35 is positioned between the panels 22 and 23 and joined to the interior surfaces of both panels to form a sandwich construction. The spacer layer in the illustrative embodiment is shown as including a central film layer 36 with a layer of adhesive 37 on its upper surface connected to the interior surface panel 22 and a second layer of adhesive 38 on its lower surface adhered to the interior surface of panel 23. The spacer layer 35 includes apertures 39 surrounding each aligned pair of contact zones 25 and 27, each pair of contact zones forming an individual switch site.

Figure 6:
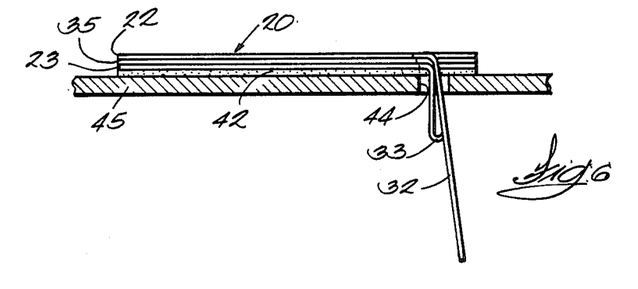
FIG. 6 is a side view illustrating the application of the switch of FIGS. 3-5 to a support member.
Figure 7:
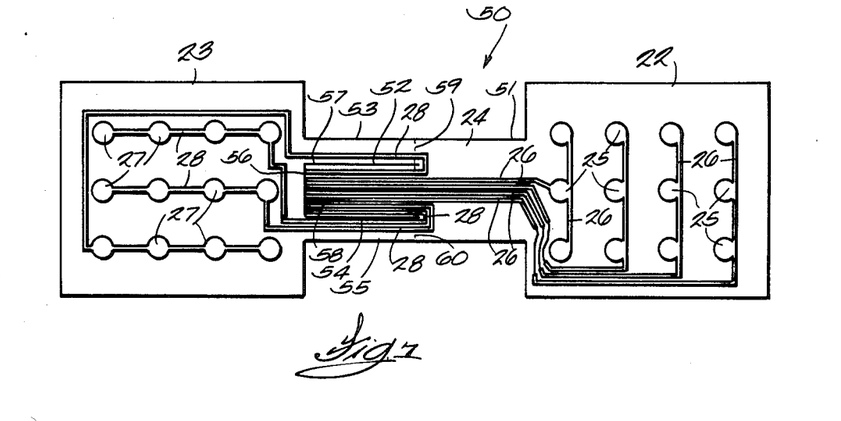
FIG. 7 is a plan view of a blank for a second embodiment of a folded membrane switch according to the present invention.

The application of the switch 20 to an apparatus is illustrated in FIG. 6. The switch 20 is shown as affixed to a flat wall panel 45 which is intended to represent any suitable supporting surface of an apparatus and retained in place by a layer 42 of application adhesive which is applied to the bottom of the exterior of second contact-carrying panel 23 of the switch. The wall panel 45 includes a slot 44 through which extend the tail portion 32 of panel 24 and the part of panel 24 that is folded along the fold line 33. The end of the tail portion 32 will be connected to suitable circuitry. A bezel, not shown, will normally be attached to the panel 45 to surround the periphery of the switch 20 and cover the edges of the switch.

(c) Second Embodiment of New Folded Switch, FIGS. 7-10

A second embodiment of the new folded membrane switch of this invention is illustrated in FIGS. 7-10. The membrane switch 50 shown in these drawings includes a number of elements that are the same as the embodiment of FIGS. 3-6, and are identified by the same reference numerals. Membrane switch 50 of FIGS. 7-10 is folded from a blank 51 that has the same three panels 22, 23 and 24 as the first embodiment, the panels 22 and 23 being the contact-carrying panels of the construction. The intermediate third panel 24 of the blank 51 includes a U-shaped slit comprising a first longitudinal leg formed by a slit 52 parallel to and spaced from longitudinal edge 53 of third panel 24, a second longitudinal leg comprising a slit 54 parallel to slit 52 but spaced therefrom inwardly of the second longitudinal edge 55 of panel 24, and a transverse slit 56 connecting the ends of slits 52 and 53 remote from the panel 22. The slits 52, 54 and 56 form a U-shaped slit 57 that defines a tail panel 58 of the blank 50. Conductive tracks 26 on first contact-carrying panel 22 connect contact zones 25 in columns and extend across the third panel 24 and terminate at the end of the tail panel 58, i.e. along transverse slit 56. Conductive tracks 28 carried by the second contact-carrying panel 23 connect contact zones 27 in rows and extend along the third panel 24 outboard of slits 52 and 54 and then turn back and extend along tail panel 58 to also terminate at the end thereof along the slit 56. Fold line 59 extends from the first longitudinal edge 53 of third panel 24 and intersects the first slit 52; a similar fold line 60 extends from the second longitudinal edge 55 of third panel 24 and intersects slit 54.

Figure 8:
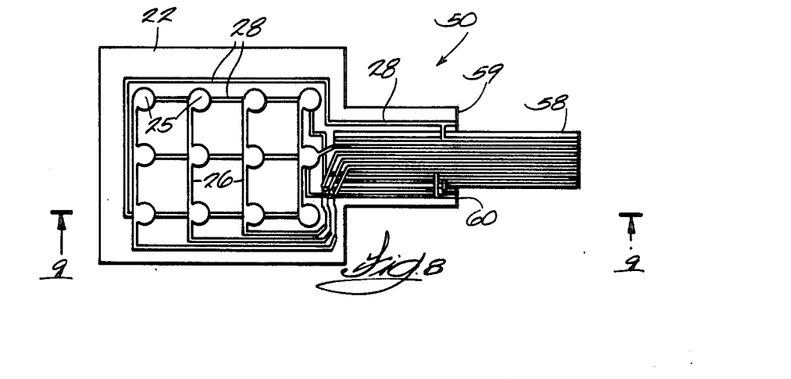
FIG. 8 is a plan view of the blank of FIG. 7 folded to form a membrane switch of the present invention.
Figure 9:
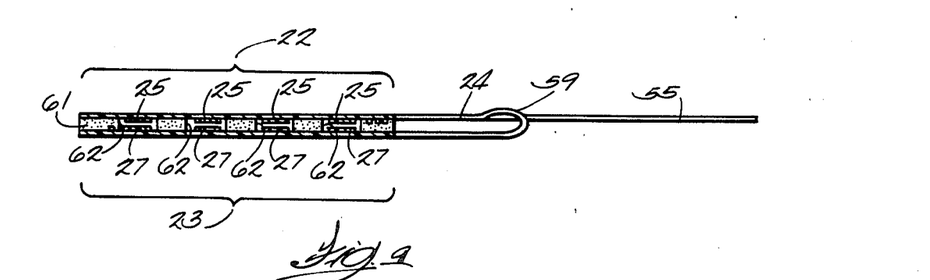
FIG. 9 is a sectional view of the switch as illustrated in FIGS. 7 and 8 taken along the plane of line 9—9 of FIG. 8.

Membrane switch 50 is illustrated in its folded and assembled condition in plan view in FIG. 8 and in sectional view in FIG. 9. The first contact-carrying panel 22 is folded over into registry with second contact-carrying panel 23 by folding the blank 51 along the fold lines 59 and 60. Contacts 25 on what is now the interior surface of panel 22 are aligned with contacts 27 on the interior surface of panel 23. With this folding action, tail panel 58, defined by the U-shaped slit 57, is separated from the panel along the slit and rotated so as to extend in a direction opposite to panels 22 and 23 as shown in FIGS. 8 and 9. The contact-carrying panels 22 and 23 are joined together by a spacer layer 61 illustrated in FIG. 9 as comprising a layer of adhesive joining together the interior facing surfaces of panels 22 and 23. Spacer layer 61 includes an aperture 62 positioned between each pair of contact zones 25 and 27. As with the first embodiment, it will be noted from FIGS. 8 and 9 that the fold lines 59 and 60 are positioned remote from the contact-carrying panels 22 and 23 instead of being along an edge therebetween.

Figure 10:
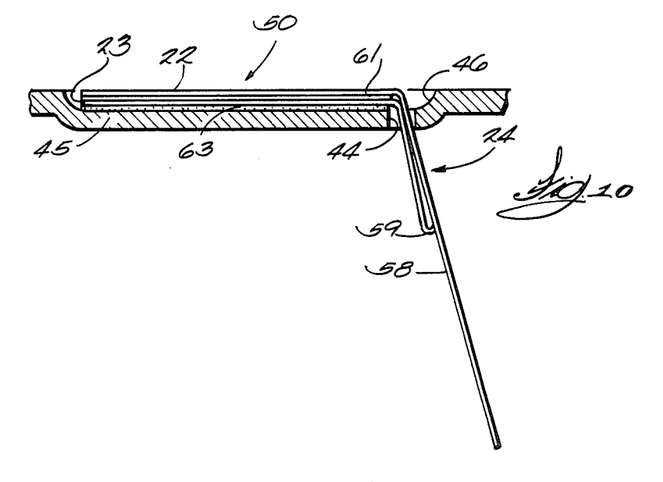
FIG. 10 is a side view, partly in section and with portions broken away, showing the application of the switch of FIGS. 7-9 to a support member.

FIG. 10 illustrates the application of folded switch 50 to a recessed wall panel 45 that includes a slot 44. The exterior surface of the second contact-carrying panel 23 is affixed to the wall panel 45 by a layer of application adhesive 63 which covers the entire exposed surface area of panel 23. Intermediate third panel 24 of the switch extends through the slot 44 so that the portion thereof folded along fold lines 59 and 60 will be underneath the wall panel 42; the tail portion 58 also will be underneath the wall panel 42 for connection to other circuitry. The switch fits within recess 46 formed in the panel 45. A faceplate, not shown, would normally be affixed over the exposed outer surface of panel 22 of the switch. Switch 50 also can be affixed to a flat panel 42 as in FIG. 6.

(d) Third Embodiment of New Folded Switch, FIGS. 11-14.

A third embodiment of the new folded membrane switch of this invention is illustrated in FIGS. 11-14. The membrane switch 70 shown in these drawings also includes a number of elements that are the same as parts of the first embodiment of FIGS. 3-6 and are therefore identified by the same reference numerals.

Figure 11:
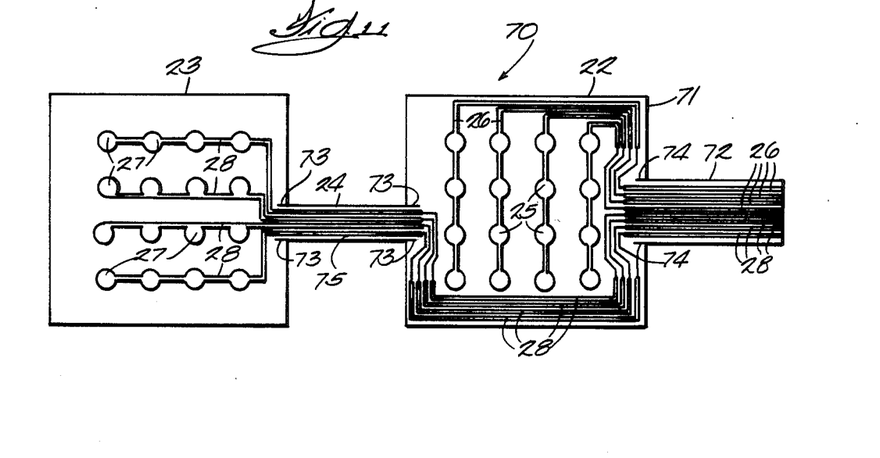
FIG. 11 is a plan view of a blank of a third embodiment of a folded membrane switch of the present invention.
Figure 12:
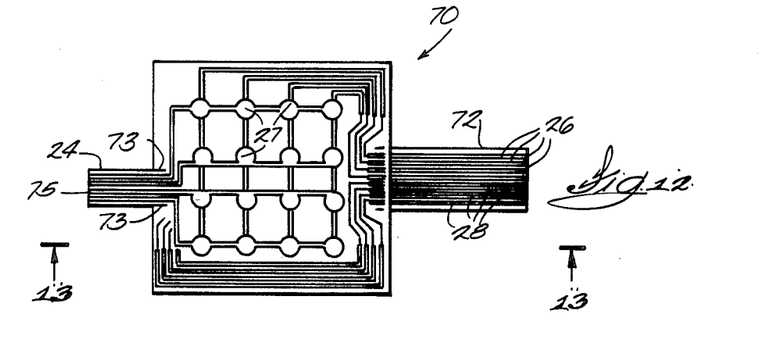
FIG. 12 is a plan view of the blank of FIG. 11 folded to form a membrane switch of the present invention.

Membrane switch 70 is folded from a blank 71 that has the same three panels 22, 23 and 24 as the first embodiment, the panels 22 and 23 being the contact-carrying panels of the construction. The intermediate third panel 24 of the blank 71 connects panels 22 and 23. Conductive contact zones 25 are carried on the upper surface of first contact-carrying panel 22 as viewed in FIG. 11 and are connected together in columns by conductive tracks 26. The conductive tracks 26 extend along the panel 22 and across tail panel 72 which extends from an edge of panel 22, the conductive tracks 26 terminating at the end of the tail panel. Contact zones 27 are carried on the upper surface of second contact-carrying panel 23 as viewed in FIG. 11 and connected together in rows by conductive tracks 28. The conductive tracks 28 extend across intermediate third panel 24, across first contact-carrying panel 22 and onto tail panel 72 to terminate at the end thereof. Short longitudinal slits 73 may be formed as shown in FIG. 11 to extend into panels 22 and 23 a short distance from each end of the intermediate third panel 24, the slits 73 being aligned with the longitudinal edges of the panel. Also, slits 74 may be formed to extend slightly into panel 22 along the longitudinal edges of tail panel 72. A fold line 75 is formed transversely across panel 24 at the center thereof.

Figure 13:
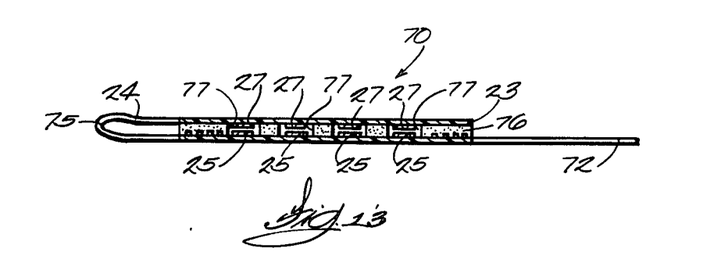
FIG. 13 is a sectional view of the switch of the FIGS. 10 and 11 taken along the plane of line 13—13 of FIG. 12.

To form the assembled switch 70 from blank 71, the intermediate third panel 24 is folded along fold line 75 to position second contact-carrying panel 23 above and in registry with first contact-carrying panel 22. This positions the contact zones 25 on the interior surface of the first contact-carrying panel 22 in alignment with contact zones 27 on the interior surface of panel 23. As shown in FIG. 13, a spacer layer 76, shown as a layer of apertured adhesive in the illustrative embodiment, is positioned between the panels 22 and 23 and joins together the two panels in spaced relationship. The spacer layer 76 includes apertures 77, there being one such aperture for each pair of aligned contact zones 25 and 27.

Figure 14:
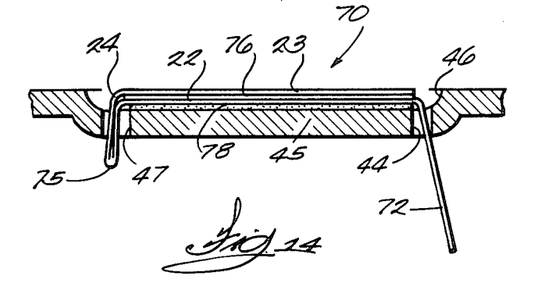
FIG. 14 is a side view, partly in section and with portions broken away, showing the application of the switch of FIGS. 11-13 to a support member.

The folded switch 70 is shown affixed to recessed wall panel 45 of any suitable apparatus in FIG. 14. The switch is affixed to the wall panel 45 by a layer of application adhesive 78 that covers the exterior surface of the first contact-carrying panel 22. Tail panel 72 of the switch is folded downwardly to extend through slot 44 of the wall panel 45; the slits 74 aid in bending the tail to this position. The folded intermediate third panel 24 extends through a second slot 47 formed in the wall panel 45 so that the fold line 75 is positioned underneath the wall panel. Switch 70 fits within recess 46 formed in panel 45 and, as with previous embodiments, a faceplate, not shown, may be affixed over the exposed exterior surface of second contact-carrying panel 23.

(e) Materials of Construction

The novel foldable membrane switches 20, 50 and 70 described above can be made of materials now generally used for membrane switches. The blanks 21, 51 and 71 can be any foldable nonconductive flexible plastic film suitable for membrane switches: polyester films, such as polyethylene terephthalate films, are the most commonly used materials, although, polycarbonate films, polyimide films and polysulfone films, as well as others such as polyolefin and unplasticized polyvinyl chloride films, may be used. The film can be in the range of about 1 to 15 mils thick, or thicker if so desired, with 5 mil thick films being preferred as providing physical properties appropriate to most membrane switch applications at a reasonable cost and also being easy to fold. Similar films may be used for the spacer layers, such as spacer layer 35 of the first embodiment.

The conductive patterns including contact zones 25 and 27 and conductive tracks 26 and 28 can be printed onto the blanks 21, 51 and 71, such as by screen printing conductive inks containing silver, gold, copper, carbon or graphite or other appropriate metal powders dispersed in a binder to form the selected pattern. Many suitable conductive inks are known in the art and are commercially available. Also, however, the conductive patterns can be formed by vacuum deposition of conductive metals such as silver, gold, aluminum or copper onto the surface of the blanks, as well as by etching techniques or by plating techniques.

The adhesive layers such as the spacer layers and application adhesive layers described above may comprise heat activated adhesive, thermoset adhesive, or pressure sensitive adhesive. Many suitable adhesives are well known in the art, and a particular adhesive should be selected with regard to the specific materials employed for the switches. The adhesive layers may be of any selected thickness, with a thickness in the range of about 0.1 to 5 mils being suitable for most membrane switch constructions, although the layers can be thicker if so desired.

The particular forms of conductive patterns illustrated in the switches are not part of the present invention; the patterns can be of any design suitable for a particular switch application. For example, the contact zones 25 and 27 may be formed as elements having interdigitated fingers or elements having a grid-like pattern rather than the exemplary constructions described above.

CONCLUSION

There has thus been described new constructions for foldable membrane switches comprising spaced first and second contact-carrying panels that are connected together along an intermediate third panel. The switch is folded along the third panel to place the two contact-carrying panels in aligned relationship with regard to conductive patterns carried thereon. The tail panel by which the switch is to be connected to external circuitry may be a portion of the third panel as in the first and second embodiments or a separate element extending from one of the contact-carrying panels as in the third embodiment.

The new folded switch constructions described herein solve the problems associated with the prior art foldable membrane switches. Thus, by comparison of the prior art construction illustrated in FIGS. 1 and 2 with the new constructions illustrated in FIGS. 3–14, the following differences will be noted. (1) The fold line in the new membrane switches of this invention is located remote from the two panels carrying contact zones. This results in a construction in which the bulge produced by the fold line is not located along an edge between the panels carrying the contact zones, so that there is no folded edge that would interfere with a faceplate secured over the exterior surface of the switch. Thus the fold lines between the contact-carrying panels in the new construction can be disposed under a supporting wall panel such as illustrated in FIGS. 6, 10 and 14. (2) The folds along the intermediate third panel in the membrane switches of the present invention can be made rather loose since there is no need to produce a tight fold in order to minimize the bulge effect encountered with the prior art constructions. This has the benefit in that little or no stress is exerted on parts of the conductive pattern that extend about the fold line, which in turn can result in a reduction of switch failure. (3) The new membrane switches of this invention do not have an uncovered portion of the conductive pattern on a contact-carrying panel crossing a fold line which is exposed to external or atmospheric elements as in the prior art constructions. Instead, the portion of a conductive pattern crossing the fold line in the switches of this invention can be located under or behind a supporting wall panel and thereby protected from attack by atmospheric contaminants. (4) Consideration of FIGS. 6, 10 and 14 will show that the foldable membrane switches of the present invention can be applied to supporting panels by a layer of application adhesive that covers all of the external surface of one of the contact-carrying panels of the switch. This is not possible with the prior art foldable membrane switches, as can be seen by reference to FIG. 2. (5) Also, the contact-carrying panels in the folded switches of the present invention can be joined together by a spacer layer which extends over the entire area of the two panels. This provides for a significant reduction in the possibility of the two panels separating from one another over a period of time since there is no folded edge between the panels that can tend to cause the panels to separate, which is the case with the prior art membrane switches.

The membrane switches 20, 50 and 70 can be used in any type of installation in which membrane switches are employed. The switches may be made to have a plurality of contacts on each contact-carrying panel, or they can be made with only one contact on each such panel. A typical installation will include a membrane switch with a plurality of contacts on each contact-carrying panel arranged in a matrix of rows and columns of switch sites, such as a keyboard. The rows can be connected to a drive circuit and the columns connected to a sensing circuit, or vice versa, the connections between the external drive and sensing circuits and the switch being made at the tail of the switch. The drive circuit may apply a number of pulses corresponding to the number of rows of contact zones to each row in sequence under the control of a clock. The sensing circuit is designed to sense the several columns of contact zones in sequence, also under the control of a clock, so that the timing of any sensed output identifies the specific switch site that has been actuated.

The present invention has been described above by reference to three specific embodiments illustrating its principles of construction. However, it is understood that those of ordinary skill in the art will be able to devise changes to the three embodiments that will remain within the scope of the present invention.

I claim:

1. In a blank of plastic film for folding into a membrane switch, the blank including (a) a first contact-carrying panel having at least one contact zone on a surface thereof, and (b) a second contact-carrying panel having at least one contact zone on a surface thereof, the improvement comprising:

(1) an intermediate third panel positioned between the first contact-carrying panel and the second contact-carrying panel, the intermediate third panel being joined to both the first and second contact-carrying panels;

(2) a conductive track for each contact zone on the first contact-carrying panel extending along the first contact-carrying panel, and a conductive track for each contact zone on the second contact-carrying panel extending along the second contact-carrying panel, each conductive track on said first and second contact-carrying panels also extending along the intermediate third panel;

(3) the blank being foldable along the intermediate third panel to position the surface of the first contact-carrying panel having a contact zone facing the surface of the second contact-carrying panel having a contact zone, with a contact zone on one contact-carrying panel aligned with a contact zone on the other contact-carrying panel to provide an individual switch site; and (4) the intermediate third panel further includes slits defining a tail panel for connecting a membrane switch folded from the blank to external electrical circuitry as a portion of the third panel, said tail panel portion being separable from the balanace of the intermediate third panel along said slits upon folding of the third panel, and the conductive tracks on both the first and second contact-carrying panels extend along the intermediate third panel and said tail panel portion thereof.

2. A blank according to claim 1, wherein:
the slits defining the tail panel portion define a U-shaped slit in the intermediate third panel.

3. A blank according to claim 1, wherein:
the slits defining the tail panel portion of the intermediate third panel include (a) a short first edge slit extending from an edge of the intermediate panel partly into a selected one of the first or second circuit-carrying panels, (b) an end slit extending from the first edge slit across the circuit-carrying panel, and (c) a second edge slit extending from the end slit part way across the intermediate third panel, the blank being foldable along a fold line extending across the intermediate third panel to the second edge slit, and another short slit extends from another edge of the intermediate third panel partly into the selected circuit-carrying panel the same distance as the short first edge slit.

4. A blank according to claim 3, wherein:
a slit corresponding in length to said short first edge slit and said another short slit extends from each edge of the intermediate third panel partly into the other of the first and second circuit-carrying panels.

5. A membrane switch formed from a folded blank according to claim 1, 3, 4 or 2 and including a spacer layer between the surface of the first contact-carrying panel having a contact zone and the surface of the second contact-carrying panel having a contact zone, the spacer layer including an aperture at each switch site.

* * * * *